(12) United States Patent
Choi et al.

(10) Patent No.: US 8,715,895 B2
(45) Date of Patent: May 6, 2014

(54) PHOTOSENSITIVE RESIN COMPOSITION FOR COLOR FILTER AND COLOR FILTER USING THE SAME

(75) Inventors: Jung-Sik Choi, Uiwang-si (KR); Chang-Min Lee, Uiwang-si (KR); Min-Sung Kim, Uiwang-si (KR); Jin-Woo Park, Uiwang-si (KR); Myung-Ho Cho, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 59 days.

(21) Appl. No.: 13/590,471

(22) Filed: Aug. 21, 2012

(65) Prior Publication Data
US 2013/0164683 A1   Jun. 27, 2013

(30) Foreign Application Priority Data

Dec. 22, 2011 (KR) .......................... 10-2011-0140583

(51) Int. Cl.
*G03F 7/004* (2006.01)
*G02B 5/20* (2006.01)

(52) U.S. Cl.
USPC .......................................... 430/7; 430/287.1

(58) Field of Classification Search
None
See application file for complete search history.

(56) References Cited

U.S. PATENT DOCUMENTS

| 5,278,009 A | 1/1994 | Iida et al. |
| 5,876,895 A | 3/1999 | Hishiro et al. |
| 5,916,713 A * | 6/1999 | Ochiai et al. ...................... 430/7 |
| 2011/0101268 A1 | 5/2011 | Choi et al. |

FOREIGN PATENT DOCUMENTS

| JP | 60-237403 A | 11/1985 |
| JP | 01-152449 A | 6/1989 |
| JP | 01-200353 A1 | 8/1989 |
| JP | 04-007373 A | 1/1992 |
| JP | 04-091173 A | 3/1992 |
| JP | 04-163552 A | 6/1992 |
| JP | 2006-350153 A * | 12/2006 |
| JP | 2011-162716 A * | 8/2011 |
| KR | 1992-0005780 | 7/1992 |
| KR | 1992-7002502 | 9/1992 |
| KR | 1994-0005617 | 6/1994 |
| KR | 1995-7000359 | 1/1995 |
| KR | 1995-0011163 | 9/1995 |
| KR | 2009-0062898 A | 6/2009 |
| KR | 2009-0062900 A | 6/2009 |
| KR | 2009-0066076 A | 6/2009 |
| KR | 2009-0074432 A | 7/2009 |
| KR | 2010-0035627 A | 4/2010 |
| KR | 2010-0066197 A | 6/2010 |
| KR | 2010-0068514 A | 6/2010 |
| KR | 2011-0073372 A | 6/2011 |

OTHER PUBLICATIONS

Computer-generated translation of JP 2011-162716 (Aug. 2011).*
Computer-generated translation of JP 2006-350153 (Dec. 2006).*

* cited by examiner

*Primary Examiner* — John A. McPherson
(74) *Attorney, Agent, or Firm* — Additon, Higgins, Pendleton & Ashe, P.A.

(57) ABSTRACT

Disclosed are a photosensitive resin composition for a color filter that includes (A) a binder resin including phenol-based resin represented by the following Chemical Formula 1; (B) a photopolymerizable monomer; (C) a photopolymerization initiator; (D) a colorant; and (E) a solvent, and a color filter using the same.

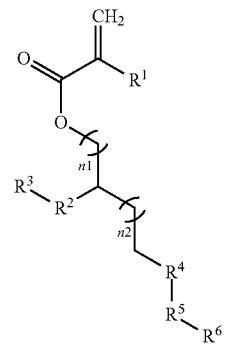

[Chemical Formula 1]

In Chemical Formula 1, each substituent is the same as defined in the detailed description.

9 Claims, No Drawings

PHOTOSENSITIVE RESIN COMPOSITION FOR COLOR FILTER AND COLOR FILTER USING THE SAME

CROSS-REFERENCE TO RELATED APPLICATIONS

This application claims priority to and the benefit of Korean Patent Application No. 10-2011-0140583 filed in the Korean Intellectual Property Office on Dec. 22, 2011, the entire disclosure of which is incorporated herein by reference.

FIELD

This disclosure relates to a photosensitive resin composition for a color filter and a color filter using the same.

BACKGROUND

With many advantageous properties such as light weight, thinness, low price, low power consumption, and fine joining property with an integrated circuit, the application range of liquid crystal display devices has increased to include such fields as laptop computers, personal digital assistants (PDAs), mobile phones, color television (TV) sets, and the like. A liquid crystal display device is formed of a lower substrate including a light shield film (e.g., black matrix), a color filter, and an ITO pixel electrode; an active circuit portion including a liquid crystal film, a thin film transistor, and a capacitor film; and an upper substrate including an ITO pixel electrode. The lower substrate may be referred to as a color filter array, and the upper substrate may be referred to a TFT array.

The color filter is fabricated by forming red pixels, green pixels, and blue pixels by dispersing pigment particulates in a photosensitive resin composition and the light shield film on a glass substrate. The light shield film blocks light that is not transmitted through a transparent pixel electrode of the substrate in order to prevent the contrast from decreasing due to light transmitted through the thin film transistor, and the red, green, and blue pigment layers have light of specific wavelengths transmitted therethrough among white light to thereby express colors.

In general, a color filter substrate can be fabricated by dyeing, printing, pigment dispersion, electrophoretic deposition (EPD), inkjet printing, and the like. The pigment dispersing method is a method for fabricating a color filter by repeating a series of processes including coating a transparent substrate with a photopolymerizable composition including a coloring agent, exposing the substrate to light through a pattern of a desired shape, and removing unexposed areas with a solvent to thereby thermally cure the resultant structure. The pigment dispersing method can maintain a uniform thickness of a film while improving heat resistance and durability, which are some of the most important characteristics of a color filter, and thus it is widely used for fabrication of a light shield film.

The resist fabricated through the pigment dispersing method is fabricated by using a photosensitive resin composition including two components, a polymer that is a binder resin which functions as a supporter and maintains a uniform thickness, and a photopolymerizable monomer for forming a photoresist pattern by reaction with light during the light exposure. Along with these two components, a pigment dispersion, a polymerization initiator, an epoxy resin, a solvent, and other additives may be also included. Examples of the binder resin used for the pigment dispersion method are a polyimide resin disclosed in Japanese Patent Laid-Open Publication No. Sho 60-237403, a photosensitive resin including an acrylic-based polymer disclosed in Japanese Patent Laid-Open Publication Nos. Hei 1-200353, Hei 4-7373, and Hei 4-91173, a radical polymerization-type photosensitive resin including an acrylate monomer, an organic polymer binder, and a photopolymerization initiator disclosed in Japanese Patent Laid-Open Publication No. Hei 1-152449, and a photosensitive resin including a phenol resin, a cross-linking agent having an N-methylol structure, and a photo acid generator disclosed in Japanese Patent Laid-Open Publication No. Hei 4-163552 and Korean Patent Publication No. 1992-0005780.

Although using a photosensitive polyimide or a phenol-based resin as a binder resin in a pigment dispersion method can provide high heat resistance, there are also drawbacks of low sensitivity and use of an organic solvent for development. Also, a conventional system using an azide compound as a photoresist can have problems of low sensitivity, degraded heat resistance, and an oxygen effect during exposure. Generally, an acrylic-based resin can have excellent heat resistance, shrinkage resistance, and chemical resistance, but tends to have degraded sensitivity, developability, and close contacting (adhesion) properties. Moreover, the sensitivity, developability, and close contacting properties of a light shield film deteriorate more than in other coloring photosensitive resin compositions because the light shield film needs more black pigment to satisfy the required optical density.

SUMMARY

One embodiment provides a photosensitive resin composition for a color filter that can have excellent pattern forming properties, minimum pattern forming properties, heat resistance, and chemical resistance.

Another embodiment provides a color filter manufactured using the photosensitive resin composition for a color filter.

According to one embodiment, provided is a photosensitive resin composition for a color filter that includes (A) a binder resin including phenol-based resin represented by the following Chemical Formula 1; (B) a photopolymerizable monomer; (C) a photopolymerization initiator; (D) colorant; and (E) a solvent.

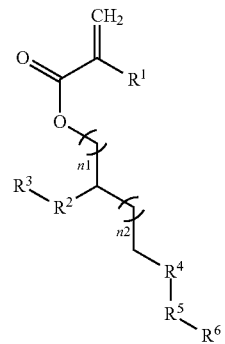

[Chemical Formula 1]

In Chemical Formula 1, $R^1$ and $R^6$ are the same or different and are each independently hydrogen or substituted or unsubstituted C1 to C20 alkyl, $R^2$ and $R^4$ are the same or different and are each independently a single bond, —O—, —NH—, or —S—, $R^3$ is a substituent selected from the following Chemical Formulae 2 to 8, $R^5$ is substituted or unsubstituted C6 to C30 arylene, and $n^1$ and $n^2$ are the same or different and are each independently integers ranging from 0 to 5.

[Chemical Formula 2]

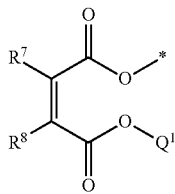

[Chemical Formula 3]

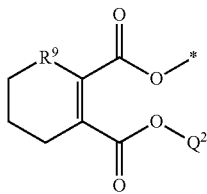

[Chemical Formula 4]

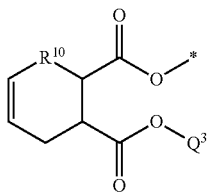

[Chemical Formula 5]

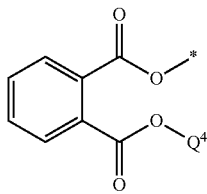

[Chemical Formula 6]

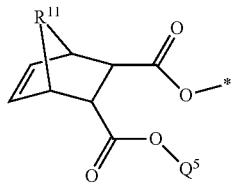

[Chemical Formula 7]

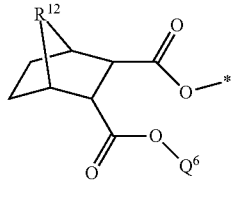

[Chemical Formula 8]

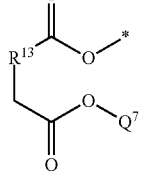

In Chemical Formulae 2 to 8, $R^7$ and $R^8$ are the same or different and are each independently hydrogen, substituted or unsubstituted C1 to C20 alkyl, an ester group, or an ether group, $R^9$, $R^{10}$, $R^{12}$ and $R^{13}$ are the same or different and are each independently substituted or unsubstituted C1 to C30 alkylenene, $R^{11}$ is —O—, —S—, —NR— (wherein R is hydrogen, substituted or unsubstituted C1 to C20 alkyl, or substituted or unsubstituted C3 to C20 alkyl), or substituted or unsubstituted C1 to C30 alkylene, and $Q^1$ to $Q^7$ are the same or different and are each independently hydrogen or a substituent represented by the following Chemical Formula 9.

[Chemical Formula 9]

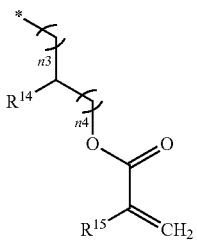

In Chemical Formula 9, $R^{14}$ is a hydroxy group, an amino group, or a thiol group, $R^{15}$ is hydrogen or substituted or unsubstituted C1 to C30 alkyl, and $n^3$ and $n^4$ are the same or different and are each independently integers ranging from 0 to 5.

The phenol-based resin may include a compound represented by the following Chemical Formula 10.

[Chemical Formula 10]

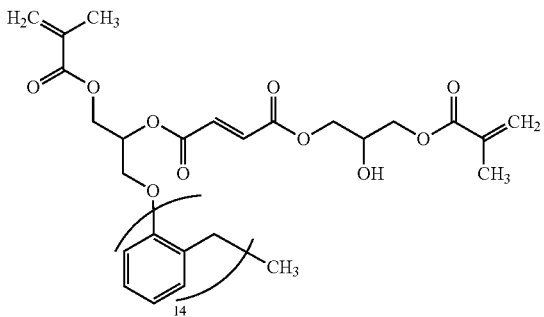

The phenol-based resin may have an acid value of about 1 to about 150 mgKOH/g.

The phenol-based resin may have a weight average molecular weight of about 500 to about 30,000 g/mol.

The binder resin may further include an acrylic-based resin, a cardo-based resin, or a combination thereof, wherein the phenol-based resin may be included in an amount of about 0.5 to about 20 wt % based on the total amount of the binder resin.

The photosensitive resin composition for a color filter may include about 1 to about 40 wt % of the binder resin (A); about 1 to about 30 wt % of the photopolymerizable monomer (B); about 0.1 to about 10 wt % of the photopolymerization initiator (C); about 1 to about 40 wt % of the colorant (D); and balance amount of the solvent (E).

The photosensitive resin composition may further include at least one additive selected from malonic acid; 3-amino-1,2-propanediol; a silane-based coupling agent with a vinyl group or a (meth)acryloxy group; a leveling agent; a fluorine-based surfactant; and a radical polymerization initiator.

According to another embodiment, a color filter manufactured using the photosensitive resin composition for a color filter is provided.

Further embodiments will be described in detail.

A color filter having excellent pattern forming properties, minimum pattern forming properties, heat resistance, and chemical resistance may be provided, and thus may be applied to an electronic display device such as a liquid crystal display device.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" may refer to one substituted with a substituent including halogen (F, Cl, Br, I), a hydroxy group, C1 to C20 alkoxy, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof.

As used herein, when a definition is not otherwise provided, the term "alkylenearyl" may refer to a substituent including C1 to C20 alkylene linked to C6 to C30 aryl, and the term "arylenealkyl" may refer to a substituent including a C6 to C30 arylene linked to C1 to C20 alkyl.

As used herein, when a definition is not otherwise provided, the term "hetero" may refer to one including at least one heteroatom including N, O, S, and P, or a combination thereof in a ring.

As used herein, when a definition is not otherwise provided, the term "(meth)acrylate" may refer to "acrylate" and "methacrylate", and the term "(meth)acrylic acid" may refer to "acrylic acid" and "methacrylic acid".

The photosensitive resin composition for a color filter according to one embodiment includes (A) a binder resin including a phenol-based resin, (B) a photopolymerizable monomer, (C) a photopolymerization initiator, (D) a colorant and (E) a solvent.

Hereinafter, each component of the photosensitive resin composition according to one embodiment is described in detail.

(A) Binder Resin

The binder resin may include a phenol-based resin represented by the following Chemical Formula 1.

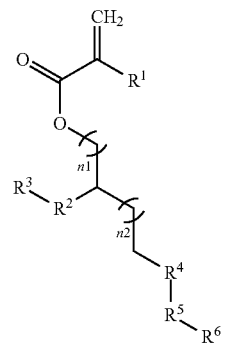

[Chemical Formula 1]

In Chemical Formula 1, $R^1$ and $R^6$ are the same or different and are each independently hydrogen or substituted or unsubstituted C1 to C20 alkyl, $R^2$ and $R^4$ are the same or different and are each independently a single bond, —O—, —NH—, or —S—, $R^3$ is a substituent selected from the following Chemical Formulae 2 to 8, $R^5$ is substituted or unsubstituted C6 to C30 arylene, and $n^1$ and $n^2$ the same or different and are each independently integers ranging from 0 to 5.

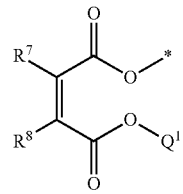

[Chemical Formula 2]

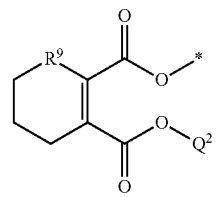

[Chemical Formula 3]

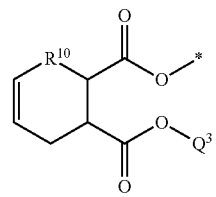

[Chemical Formula 4]

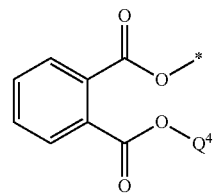

[Chemical Formula 5]

-continued

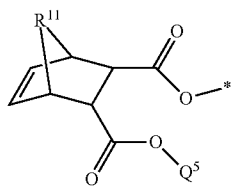
[Chemical Formula 6]

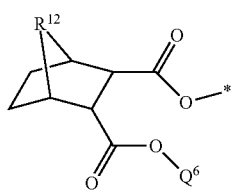
[Chemical Formula 7]

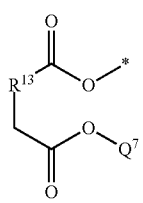
[Chemical Formula 8]

In Chemical Formulae 2 to 8, $R^7$ and $R^8$ are the same or different and are each independently hydrogen, substituted or unsubstituted C1 to C20 alkyl, an ester group, or an ether group, $R^9$, $R^{10}$, $R^{12}$ and $R^{13}$ the same or different and are each independently substituted or unsubstituted C1 to C30 alkylenene, $R^{11}$ is —O—, —S—, —NR— (wherein R is hydrogen, substituted or unsubstituted C1 to C20 alkyl, or substituted or unsubstituted C3 to C20 alkyl), or substituted or unsubstituted C1 to C30 alkylene, and $Q^1$ to $Q^7$ are the same or different and are each independently hydrogen or a substituent represented by the following Chemical Formula 9.

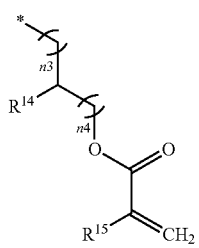
[Chemical Formula 9]

In Chemical Formula 9, $R^{14}$ is a hydroxy group, an amino group, or a thiol group, $R^{15}$ is hydrogen or substituted or unsubstituted C1 to C30 alkyl, and $n^3$ and $n^4$ are the same or different and are each independently integers ranging from 0 to 5.

Phenol-based resins represented by the above Chemical Formula 1 include resins including a substituent represented by the above Chemical Formulae 2 to 8 at the position of $R^3$, substituted or unsubstituted C6 to C30 arylene at the position of $R^5$, and three photopolymerizable groups at most. Thus, the phenol-based resin may be used to prepare a photosensitive resin composition for a color filter that can have high sensitivity and excellent chemical resistance, heat resistance, and pattern stability.

The phenol-based resin may include a compound represented by the following Chemical Formula 10.

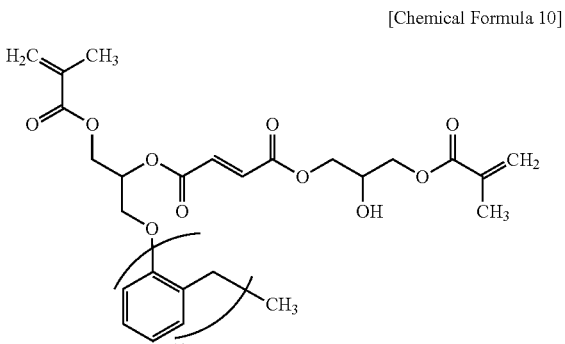
[Chemical Formula 10]

The phenol-based resin may have an acid value of about 1 to about 150 mgKOH/g, for example about 10 to about 100 mgKOH/g. When the phenol-based resin has an acid value within the above ranges, a photosensitive resin composition for a color filter that can have excellent pattern forming properties, minimum pattern forming properties, heat resistance, and chemical resistance may be provided.

The phenol-based resin may have a weight average molecular weight of about 500 to about 30,000 g/mol, for example about 2,000 to about 15,000 g/mol. When the phenol-based resin has a weight average molecular weight within the above range, a photosensitive resin composition for a color filter that can have excellent pattern forming properties, minimum pattern forming properties, heat resistance, and chemical resistance may be provided.

The binder resin may further include an acrylic-based resin, a cardo-based resin, or a combination thereof along with the phenol-based resin.

The acrylic-based resin can be a copolymer of a first ethylenic unsaturated monomer and a second ethylenic unsaturated monomer copolymerizable with the same, and a resin including at least one acrylic-based repeating unit.

The first ethylenic unsaturated monomer can be an ethylenic unsaturated monomer including at least one carboxyl group. Examples of the first ethylenically unsaturated monomer can include without limitation acrylic acid, methacrylic acid, maleic acid, itaconic acid, fumaric acid, and the like, and combinations thereof.

The acrylic-based resin can include the first ethylenic unsaturated monomer in an amount of about 5 to about 50 wt %, for example about 10 to about 40 wt %, based on the total amount (weight) of the acrylic-based resin. In some embodiments, the acrylic-based resin can include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the acrylic-based resin can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile, and the like; unsaturated amide compounds such as (meth)acrylamide, and the like. These may be used singularly or in a mixture of two or more.

Examples of the acrylic-based resin may include without limitation a (meth)acrylic acid/benzylmethacrylate copolymer, a (meth)acrylic acid/benzylmethacrylate/styrene copolymer, a (meth)acrylic acid/benzylmethacrylate/2-hydroxyethyl methacrylate copolymer, a (meth)acrylic acid/benzylmethacrylate/styrene/2-hydroxyethyl methacrylate copolymer, and the like. These may be used singularly or in a mixture of two or more.

The acrylic-based resin may have a weight average molecular weight of about 3,000 to about 150,000 g/mol, for example about 5,000 to about 50,000 g/mol, and as another example about 2,000 to about 30,000 g/mol. When the acrylic-based resin has a weight average molecular weight within the above ranges, the photosensitive resin composition may have improved physical and chemical properties and appropriate viscosity.

The acrylic-based resin may have an acid value of about 15 to about 60 mgKOH/g, for example about 20 to about 50 mgKOH/g. When the acrylic-based resin has an acid value within the above ranges, resolution of pixel patterns can be improved.

The cardo-based resin may include repeating units represented by the following Chemical Formulae 11 and 12.

$Z^1$ and $Z^2$ are the same or different and are each independently a residual group of acid dianhydride, $R^{20}$ to $R^{23}$ and $R^{26}$ to $R^{29}$ are the same or different and are each independently hydrogen, halogen or substituted or unsubstituted C1 to C20 alkyl, $R^{24}$, $R^{25}$, $R^{30}$ and $R^{31}$ are the same or different and are each independently hydrogen or substituted or unsubstituted C1 to C10 alkyl, and m and n are the same or different and are each independently integers ranging from 1 to 1000.

[Chemical Formula 13]

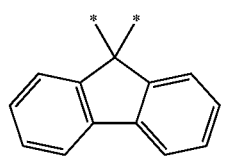

[Chemical Formula 14]

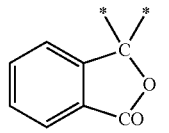

[Chemical Formula 15]

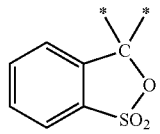

[Chemical Formula 11]

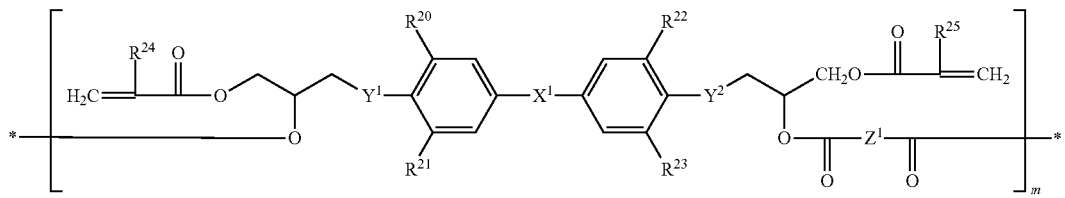

[Chemical Formula 12]

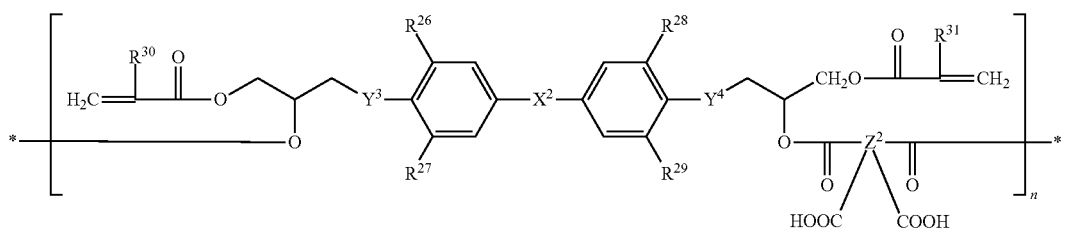

In Chemical Formulae 11 and 12, $X^1$ and $X^2$ are the same or different and are each independently a single bond, O, CO, $SO_2$, $CR_bR^c$, $SiR_dR_e$ (wherein $R_b$ to $R_e$ are the same or different and are each independently hydrogen or substituted or unsubstituted C1 to C20 alkyl), or a linking group selected from the following Chemical Formulae 13 to 23, $Y^1$ to $Y^4$ are the same or different and are each independently —O— or —NR'— (wherein R' is hydrogen, methyl, ethyl, a methanol group, an ethanol group, an allyl group, or an ester group), -continued

[Chemical Formula 16]

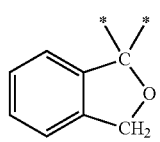

[Chemical Formula 17]

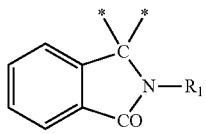

[Chemical Formula 18]

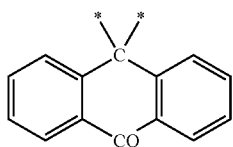

[Chemical Formula 19]

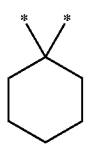

[Chemical Formula 20]

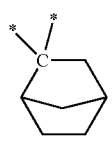

[Chemical Formula 21]

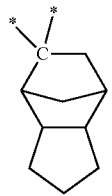

[Chemical Formula 22]

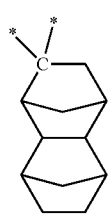

[Chemical Formula 23]

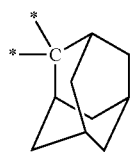

In Chemical Formula 17, $R_f$ is hydrogen, ethyl, C2H$_4$Cl, $C_2H_4OH$, $CH_2CH=CH_2$, or phenyl.

The cardo-based resin may be obtained by reacting a compound represented by the following Chemical Formula 24 and tetracarboxylic acid dianhydride.

[Chemical Formula 24]

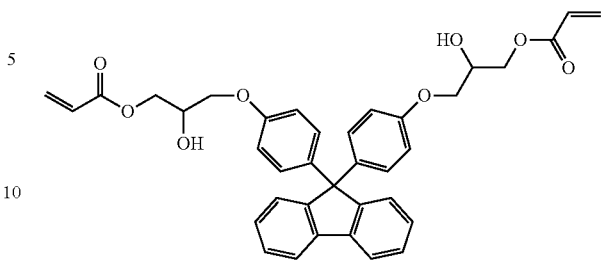

The tetracarboxylic acid dianhydride may be an aromatic tetracarboxylic acid dianhydride. Examples of the aromatic tetracarboxylic acid dianhydride may include without limitation pyromellic acid dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis(3,4-dicarboxyphenyl)hexafluoropropane dianhydride, and the like, and combinations thereof.

The cardo-based resin may have a weight average molecular weight of about 500 to about 30,000 g/mol, for example about 1,000 to about 15,000 g/mol. When the cardo-based resin has a weight average molecular weight within the above ranges, patterns may be formed without residues, there is minimal or no loss of a film thickness during development, and a good pattern may be obtained.

The photosensitive resin composition may include the phenol-based resin in an amount of about 0.5 to about 20 wt %, for example about 1 to about 10 wt %, based on the total amount (weight) of the phenol-based resin and at least one resin including the acrylic-based resin, cardo-based resin or combination thereof. In some embodiments, the photosensitive resin composition may include the phenol-based resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the phenol resin can be in a range from about any of the foregoing amounts to about any other of the foregoing amounts.

When the photosensitive resin composition includes the phenol-based resin in an amount within the above ranges, a photosensitive resin composition for a color filter that can have excellent pattern forming properties, minimum pattern forming properties, heat resistance and chemical resistance may be provided.

The photosensitive resin composition may include the binder resin in an amount of about 1 to about 40 wt %, for example about 5 to about 30 wt %, based on the total amount (weight) of the photosensitive resin composition for a color filter. In some embodiments, the photosensitive resin composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the binder resin can be in a range from about any of the foregoing amounts to about any other of the foregoing amounts.

When the photosensitive resin composition includes the binder resin in an amount within the above ranges, developability for an alkali developing solution, thickness uniformity, surface roughness, and close contacting (adhesion) properties may be improved.

(B) Photopolymerizable Monomer

The photopolymerizable monomer may be a mono-functional or multi-functional ester of (meth)acrylic acid including at least one ethylenic unsaturated double bond.

The photopolymerizable monomer causes sufficient polymerization upon exposure during pattern forming processes to form patterns that can have excellent heat resistance, light resistance, and chemical resistance, due to the ethylenic unsaturated double bond.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenolA di(meth) acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy(meth)acrylate, and the like, and combinations thereof.

Commercially available examples of the photopolymerizable monomer are as follows. Examples of the mono-functional (meth)acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like, and combinations thereof. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like, and combinations thereof. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like, and combinations thereof. The photopolymerizable monomer may be used singularly or as a mixture of two or more.

The photopolymerizable monomer may be pretreated with acid anhydride in order to improve developability.

The photosensitive resin composition may include the photopolymerizable monomer in an amount of about 1 to about 30 wt %, for example about 5 to about 20 wt %, based on the total amount (weight) of the photosensitive resin composition for a color filter. In some embodiments, the photosensitive resin composition may include the photopolymerizable monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, curing at exposure during pattern forming processes can be sufficiently performed, and reliability, heat resistance, light resistance, and chemical resistance, resolution, and close contacting forces of pattern may be realized.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2,4-bis(trichloromethyl)-6-piperonyl-s-triazine, 2,4-bis(trichloromethyl)-6-(4'-methoxystyryl)-s-triazine, and the like, and combinations thereof.

Examples of the oxime-based compound may include without limitation 2-(o-benzoyloxime)-1-[4-(phenylthio) phenyl]-1,2-octanedione, 1-(o-acetyloxime)-1-[9-ethyl-6-(2-methylbenzoyl)-9H-carbazol-3-yl]ethanone, and the like, and combinations thereof.

Other examples of the photopolymerization initiator may also include without limitation carbazole-based compounds, diketone series compounds, sulfonium borate-based compounds, diazo-based compounds, biimidazole-based compounds, and the like, and combinations thereof, besides the compounds described above.

The photosensitive resin composition may include the photopolymerization initiator in an amount of about 0.1 to about 10 wt %, for example about 1 to about 5 wt %, based on the total amount (weight) of the photosensitive resin composition for a color filter. In some embodiments, the photosensitive resin composition may include the photopolymerizable initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerizable initiator can be in a range from about any of the foregoing amounts to about any other of the foregoing amounts.

When the photopolymerization initiator is included in an amount within the above range, the composition may be sufficiently photopolymerized during the exposure during the pattern-forming process, heat resistance, light resistance, chemical resistance, resolution, and close contacting forces of pattern may be improved, and there may be minimal or no transmittance deterioration due to non-reacted initiator left after the photopolymerization.

(D) Colorant

The colorant may include a pigment.

The pigment may include a red pigment, a green pigment, a blue pigment, a yellow pigment, a black pigment, and the like, and combinations thereof.

Examples of the red pigment include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment include without limitation halogen-substituted copper phthalocyanine pigments such as C.I. green pigment 36, C.I. green pigment 7, and the like. Examples of the blue pigment include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment include without limitation isoindoline pigment such as C.I. yellow pigment 139, and the like, quinophthalone pigments such as C.I. yellow pigment 138, and the like, nickel complex pigments such as C.I. yellow pigment 150, and the like. Examples of the black pigment include without limitation aniline black, perylene black, titanium black, carbon black, and the like. The pigments may be used singularly or as a mixture of two or more and are not limited to the above described pigments.

Among them, in order to implement light blocking of a light blocking layer efficiently, the black pigment may be included. When the black pigment is used, a color calibrating agent such as anthraquinone-based pigments, perylene-based pigments, phthalocyanine-based pigments, azo-based pigments, and the like may be also used.

The photosensitive resin composition may further include a dispersing agent in order to improve dispersion of the pigment.

Specifically, the pigment may be surface-pretreated with a dispersing agent, or the pigment and dispersing agent may be added together during preparation of the photosensitive resin composition.

Examples of the dispersing agent may include without limitation non-ionic dispersing agents, anionic dispersing agents, cationic dispersing agents, and the like, and combinations thereof. Examples of the dispersing agent include without limitation polyalkyleneglycol and esters thereof, polyoxyalkylenes, polyhydric alcohol ester alkylene oxide addition products, alcohol alkylene oxide addition products, sulfonic acid esters, sulfonates, carboxylic acid esters, carboxylates, alkylamide alkylene oxide addition products, alkyl amines, and the like. The dispersing agents may be used singularly or as a mixture of two or more.

Commercially available examples of the dispersing agent are without limitation as follows: DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like (BYK); EFKA-47, EFKA-47EA, EFKA-48, EFKA-49, EFKA-100, EFKA-400, EFKA-450, and the like (EFKA chemicals); Solsperse 5000, Solsperse 12000, Solsperse 13240, Solsperse 13940, Solsperse 17000, Solsperse 20000, Solsperse 24000GR, Solsperse 27000, Solsperse 28000, and the like (Zeneka); or PB711, PB821, and the like (Ajinomoto).

The photosensitive resin composition may include the dispersing agent in an amount of about 0.01 to about 10 wt %, based on the total amount (weight) of the photosensitive resin composition for a color filter. In some embodiments, the photosensitive resin composition may include the dispersing agent in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the dispersing agent can be in a range from about any of the foregoing amounts to about any other of the foregoing amounts.

When the dispersing agent is included in an amount in the above range, dispersion of the photosensitive resin composition can be improved, which can result in excellent stability, development properties, and patterning properties during manufacture of a light blocking layer.

The photosensitive resin composition may include colorant in an amount of about 1 to about 40 wt %, for example about 2 to about 20 wt %, based on the total amount (weight) of the photosensitive resin composition. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the colorant is included in an amount within the above range, color reproducibility, curing capability, and close contacting properties of a pattern can be excellent.

(E) Solvent

The solvent has compatibility with the binder resin, the photopolymerizable monomer, the photopolymerization initiator and the colorant but does not have a reaction therewith.

The solvent is not specifically limited, but examples of the solvent include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylethylether acetate, propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetate alkyl esters such as methyl oxyacetate, ethyl oxyacetate, butyl oxyacetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like; monooxy monocarboxylic acid alkyl esters of a 2-alkoxy-2-methyl propionic acid such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate; or ketonic acid esters such as ethyl pyruvate. Furthermore, the solvent may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, phenyl cellosolve acetate, and the like. These solvents may be used singularly or in a combination.

In one embodiment, considering compatibility and reactivity, glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; propylene glycol alkylether acetates such as propylene glycol methylether acetate, propylene glycol propylether acetate, and the like may be used.

The photosensitive resin composition may include the solvent in a balance amount, for example about 50 to about 70 wt %, based on the total amount (weight) of the photosensitive resin composition for a color filter. In some embodiments, the photosensitive resin composition may include the solvent in an amount of about 50, 51, 52, 53, 54, 55, 56, 57, 58, 59, 60, 61, 62, 63, 64, 65, 66, 67, 68, 69, or 70 wt %. Further, according to some embodiments of the present invention, the amount of the colorant can be in a range from about any of the foregoing amounts to about any other of the foregoing amounts.

When the solvent is included in an amount within the above range, the photosensitive resin composition can have appropriate viscosity and thus processability during fabrication of a color filter.

(F) Other Additive(s)

The photosensitive resin composition may further include one or more other additives such as but not limited to malonic acid; 3-amino-1,2-propanediol; silane-based coupling agents with a vinyl group or a (meth)acryloxy group; leveling agents; fluorine-based surfactants; radical polymerization initiators, and the like, and combinations thereof in order to prevent stains or spots during the coating, to adjust leveling, and/or to prevent pattern residue due to non-development.

These additives may be adjusted depending on desired properties.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or in a mixture of two or more.

The photosensitive resin composition may include the silane-based coupling agent in an amount of about 0.01 to about 1 parts by weight, based on about 100 parts by weight of the photosensitive resin composition for a color filter.

The photosensitive resin composition may further include an epoxy compound in order to improve properties such as close contacting forces, as needed.

Examples of the epoxy compound may include without limitation phenol novolac epoxy resins, tetramethyl bi-phenyl epoxy resins, bisphenol A epoxy resins, alicyclic epoxy resins, and the like, and combinations thereof.

The photosensitive resin composition may include the epoxy compound in an amount of about 0.01 to about 5 parts by weight, based on about 100 parts by weight of the photosensitive resin composition for a color filter. When the epoxy resin is included in an amount within the above ranges, storage properties, close contacting forces, and the like may be improved.

In another embodiment, a color filter manufactured using the photosensitive resin composition for a color filter is provided. The color filter can be manufactured as follows.

The photosensitive resin composition for a color filter can be applied to a glass substrate using a method such as spin coating, roller coating, spray coating, and the like, at a thickness of, for example 0.5 to 10 μm to form a resin composition layer.

Then, the resin composition layer on the substrate can be radiated by a light to form a pattern for a color filter. The radiation can be performed using a light source such as UV, an electron beam, or an X-ray, for example, UV in a range of about 190 nm to about 450 nm, and as another example, about 200 nm to about 400 nm region. The radiation may be performed by further using a photoresist mask. Then, the radiated resin composition layer can be developed. Herein, an unexposed part in the resin composition layer can be dissolved to form a light blocking layer pattern, for example, a matrix pattern. The patterning process may be repeated as many times as required colors, obtaining a color filter having a desired pattern. In addition, the image pattern obtained through the process may be heated again or cured by radiating an active ray to improve crack resistance, solvent resistance, and the like.

The following examples illustrate the present invention in more detail. These examples, however, should not in any sense be interpreted as limiting the scope of the present invention.

Preparation of Phenol-Based Resin

Preparation Example 1

150 parts by weight of methacrylic acid (Daejung Chemicals & Metals Co., Ltd.), 100 parts by weight of Epiklon N-673 having a weight average molecular weight of 2,300 g/mol (DIC), 3 parts by weight of triphenylphosphine (Sigma-Aldrich Co., Ltd.), 0.5 parts by weight of 4-methoxyphenol (Daejung Chemicals & Metals Co., Ltd.), and 300 parts by weight of propyleneglycol monomethyletheracetate are put in a flask having a cooler and agitator and slowly agitated under a nitrogen atmosphere. The reaction solution is heated up to 100° C. and agitated for 12 hours for polymerization. After the polymerization, an organic layer is cleaned using a 5% NaOH aqueous solution. The first copolymer solution has a solid content of 34 wt %.

Then, 100 parts by weight of the first copolymer is put in a flask having a cooler and an agitator, and 8 parts by weight of maleic anhydride (Sigma-Aldrich Co., Ltd.) is added thereto. The mixture is slowly agitated under a nitrogen atmosphere. The reaction solution is heated up to 100° C. and agitated for 6 hours, synthesizing a second copolymer. Herein, the second copolymer has a weight average molecular weight of 4,100 g/mol and an acid value of 190 mgKOH/g.

Then, 100 parts by weight of the second copolymer is put in a flask having a cooler and an agitator, and 3 parts by weight of glycidylmethacrylate (N of Cooperation) is added thereto. The mixture is slowly agitated under a nitrogen atmosphere. The reaction solution is heated up to 100° C. and agitated for 12 hours, synthesizing a phenol-based resin. Herein, the phenol-based resin has a weight average molecular weight of 4,400 g/mol and a acid value of 130 mgKOH/g.

The synthesis mechanism of the phenol-based resin is provided in the following reaction scheme 1.

[Reaction Scheme 1]

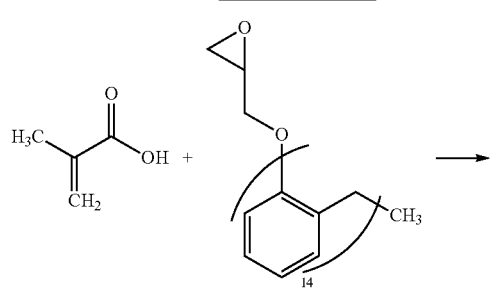

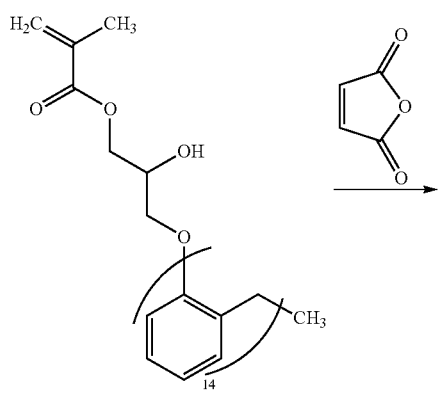

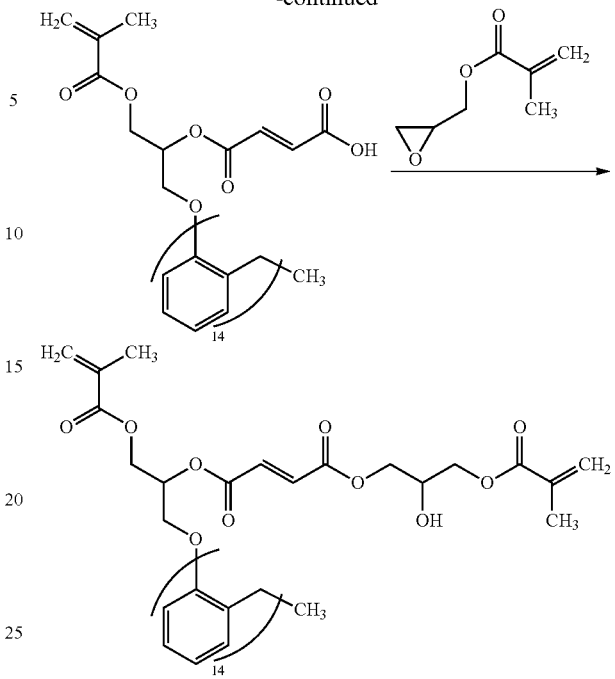

Preparation Example 2

A phenol-based resin is prepared according to the same method as Preparation Example 1 except for using 100 parts by weight of the second copolymer and adding 5 parts by weight of glycidylmethacrylate (N of Corporation) thereto in order to synthesize an acrylic-based resin. Herein, the phenol-based resin has a weight average molecular weight of 4,600 g/mol and an acid value of 90 mgKOH/g.

Preparation Example 3

A phenol-based resin is synthesized according to the same method as Preparation Example 1 except for using 100 parts by weight of the second copolymer and adding 10 parts by weight of glycidylmethacrylate (N of Corporation). Herein, the phenol-based resin has a weight average molecular weight of 5,000 g/mol and an acid value of 35 mgKOH/g.

Comparative Preparation Example 1

150 parts by weight of methacrylic acid (Daejung Chemicals & Metals Co., Ltd.), 100 parts by weight of Epiklon N-673 (DIC) having a weight average molecular weight of 2,300 g/mol, 3 parts by weight of triphenylphosphine (Sigma-Aldrich Co., Ltd.), 0.5 parts by weight of 4-methoxyphenol (Daejung Chemicals & Metals Co., Ltd.), and 300 parts by weight of propyleneglycol monomethyletheracetate are put in a flask having a cooler and an agitator, and the mixture is slowly agitated under a nitrogen atmosphere. The reaction solution is heated up to 100° C. and agitated for 12 hours for polymerization. After the polymerization, an organic layer is cleaned using a 5% NaOH aqueous solution. The phenol-based resin solution has a solid content of 34 wt %.

Comparative Preparation Example 2

150 parts by weight of methacrylic acid (Daejung Chemicals & Metals Co., Ltd.), 100 parts by weight of Epiklon N-673 (DIC) having a weight average molecular weight of 2,300 g/mol, 3 parts by weight of triphenylphosphine (Sigma-Aldrich Co., Ltd.), 0.5 parts by weight of 4-methoxyphenol (Daejung Chemicals & Metals Co., Ltd.), and 300 parts by weight of propyleneglycol monomethyletheracetate are put in a flask having a cooler and an agitator. The mixture is slowly agitated under a nitrogen atmosphere. The reaction solution is heated up to 100° C. and agitated for 12 hours for polymerization. After the polymerization, an organic layer is cleaned using a 5% NaOH aqueous solution. The first copolymer solution has a solid content of 34 wt %.

Then, 100 parts by weight of the first copolymer is put in a flask having a cooler and an agitator, and 8 parts by weight of maleic anhydride (Sigma-Aldrich Co., Ltd.) is added thereto. The mixture is slowly agitated under a nitrogen atmosphere. The reaction solution is heated up to 100° C. and agitated for 6 hours, synthesizing a phenol-based resin. Herein, the phenol-based resin has a weight average molecular weight of 4,100 g/mol and an acid value of 190 mgKOH/g.

Preparation of Black Pigment Dispersion

Preparation Example 4

15 g of carbon black (Cabot Co.), 4 g of DISPERBYK-163 (BYK), 3 g of an acrylic acid/benzylmethacrylate copolymer (NPR8000, Miwon Commercial Co., Ltd.), and 78 g of propyleneglycol methylethylacetate are mixed in a reactor, and the mixture is dispersed for 12 hours using a paint-shaker (Asada Iron Works Co. Ltd), preparing a black pigment dispersion. Herein, the black pigment dispersion includes a pigment solid of 15%.

Preparation of Photosensitive Resin Composition for Color Filter

Examples 1 to 6 and Comparative Examples 1 to 4

IRGACURE OXE02 (Shiba Co., Ltd.) as a photopolymerization initiator (C) is dissolved in propyleneglycol methyletheracetate as a solvent (E), and the solution is agitated at room temperature for 2 hours. Next, each phenol-based resin A-1 according to Preparation Examples 1 to 3 and Comparative Preparation Examples 1 and 2, a cardo-based resin (A-2, V259ME, Nippon Steel Chemical Co., Ltd), and dipentaerythritol hexaacrylate as a photopolymerizable monomer (B) are added thereto. The mixture is agitated at room temperature for 2 hours. Then, a black pigment dispersion (D) according to Preparation Example 4, a surfactant (F-482, DIC) as an additive (F), and γ-glycidoxy propyl trimethoxysilane (S-510, Chisso Co.) as a silane coupling agent are added thereto. The resulting mixture is agitated at room temperature for one hour. Subsequently, the product is three times filtered to remove impurities, preparing a photosensitive resin composition for a color filter. The compositions of the photosensitive resin compositions for a color filter are provided in the following Table 1.

TABLE 1

| | | | (unit: wt%) | | | | | | | | | |
|---|---|---|---|---|---|---|---|---|---|---|---|---|
| | | | Example | | | | | | Comparative Example | | | |
| | | | 1 | 2 | 3 | 4 | 5 | 6 | 1 | 2 | 3 | 4 |
| (A) binder resin | (A-1) phenol-based resin | Preparation Example 1 | 1.7 | — | — | 11.2 | — | — | — | — | — | — |
| | | Preparation Example 2 | — | 1.7 | — | — | 11.2 | — | — | — | — | — |
| | | Preparation Example 3 | — | — | 1.7 | — | — | 11.2 | — | — | — | — |
| | | Comparative Preparation Example 1 | — | — | — | — | — | — | 1.7 | — | 11.2 | — |
| | | Comparative Preparation Example 2 | — | — | — | — | — | — | — | 1.7 | — | 11.2 |
| | (A-2) cardo-based resin | | 9.5 | 9.5 | 9.5 | — | — | — | 9.5 | 9.5 | — | — |
| (B) photopolymerizable monomer | | | 1.8 | 1.8 | 1.8 | 1.8 | 1.8 | 1.8 | 1.8 | 1.8 | 1.8 | 1.8 |
| (C) photopolymerization initiator | | | 0.5 | 0.5 | 0.5 | 0.5 | 0.5 | 0.5 | 0.5 | 0.5 | 0.5 | 0.5 |
| (D) colorant (solid content) | | | 40 6 | 40 6 | 40 6 | 40 6 | 40 6 | 40 6 | 40 6 | 40 6 | 40 6 | 40 6 |
| (E) solvent | | | 44 | 44 | 44 | 44 | 44 | 44 | 44 | 44 | 44 | 44 |
| (F) additive | | | 2.5 | 2.5 | 2.5 | 2.5 | 2.5 | 2.5 | 2.5 | 2.5 | 2.5 | 2.5 |

Evaluation 1: Pattern Forming Properties

The photosensitive resin compositions for a color filter according to Examples 1 to 6 and Comparative Examples 1 to 4, respectively, are coated on a glass substrate and dried at 90° C. for 2.5 minutes, forming a film. The film is radiated by a light with a wavelength of 365 nm and 80 mJ/cm² after putting a pattern mask thereon. The radiated film is developed using a 1 wt % potassium hydroxide aqueous solution (a developing solution) at 23° C. and cleaned with pure water for 1 minute. Through the process, a pattern is left, removing an unnecessary part. The patterned substrate is heated for curing at 230° C. for 30 minutes, obtaining a final pattern. The 1.0 μm-high pattern is evaluated with bare eyes using an optical microscope. The result is provided in the following Table 2.

<Pattern-forming properties Evaluation Reference>
⊚: Very good pattern forming properties
○: Good pattern forming properties
Δ: Bad pattern forming properties
x: No pattern formation Evaluation 2: Minimum Pattern-Forming Properties Line width and minimum pattern forming properties of a minimum pattern of the patterns obtained in Evaluation 1 are measured. The line width of a minimum pattern with a reference to a mast size, and the results are provided in the following Table 2.

Evaluation 3: Heat Resistance

The pattern substrate formed in Evaluation 1 is additionally three times heated in a 230° C. oven for 30 minutes and the optical density (OD) change is measured. The results are provided in the following Table 2.

<Heat resistance Evaluation Reference>
⊚: within ±1.0% relative to initial OD
○: within ±3.0% relative to initial OD
Δ: within ±5.0% relative to initial OD
x: within OD relative to initial ±7.0%

Evaluation 4: Chemical Resistance

The pattern obtained in Evaluation 1 is dipped in a 5% hydrochloric acid aqueous solution, a 5% sodium hydroxide aqueous solution, N-methylpyrrolidone (NMP), and isopropylalcohol (IPA) for 30 minutes and dried and then OD change is measured. The results are provided in the following Table 2.

<Chemical Resistance Evaluation Reference>
⊚: within ±1.0% relative to initial OD
○: within ±3.0% relative to initial OD
Δ: within ±5.0% relative to initial OD
x: within ±7.0% relative to initial OD

TABLE 2

|  | Pattern forming properties | Line width of minimum pattern (um) | Heat resistance | Chemical resistance |
| --- | --- | --- | --- | --- |
| Example 1 | ⊚ | 8 | ⊚ | ⊚ |
| Example 2 | ⊚ | 7 | ⊚ | ⊚ |
| Example 3 | ⊚ | 8 | ⊚ | ⊚ |
| Example 4 | ⊚ | 8 | ⊚ | ⊚ |
| Example 5 | ⊚ | 6 | ⊚ | ⊚ |
| Example 6 | ⊚ | 3 | ⊚ | ⊚ |
| Comparative Example 1 | ⊚ | 9 | ○ | ○ |
| Comparative Example 2 | ⊚ | 9 | ○ | ○ |
| Comparative Example 3 | ○ | 13 | ○ | ○ |
| Comparative Example 4 | ○ | 11 | ○ | ○ |

Based on Table 2, the photosensitive resin compositions including a phenol-based resin according to Examples 1 to 6 have excellent pattern forming properties, minimum pattern forming properties, heat resistance, and chemical resistance compared with the photosensitive resin compositions according to Comparative Examples 1 to 4.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
(A) a binder resin including phenol-based resin represented by the following Chemical Formula 1;
(B) a photopolymerizable monomer;
(C) a photopolymerization initiator;
(D) a colorant; and
(E) a solvent:

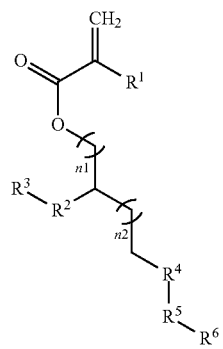

[Chemical Formula 1]

wherein, in Chemical Formula 1,
$R^1$ and $R^6$ are the same or different and are each independently hydrogen or substituted or unsubstituted C1 to C20 alkyl,
$R^2$ and $R^4$ are the same or different and are each independently a single bond, —O—, —NH—, or —S—,
$R^3$ is a substituent selected from the following Chemical Formulae 2 to 8,
$R^5$ is substituted or unsubstituted C6 to C30 arylene, and
$n^1$ and $n^2$ are the same or different and are each independently integers ranging from 0 to 5,

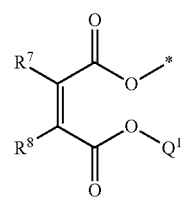

[Chemical Formula 2]

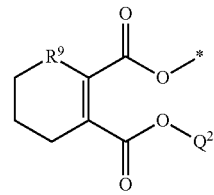

[Chemical Formula 3]

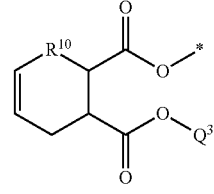

[Chemical Formula 4]

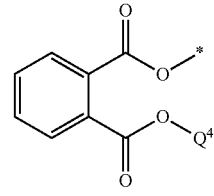

[Chemical Formula 5]

-continued

[Chemical Formula 6]

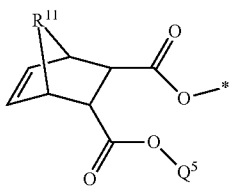

[Chemical Formula 7]

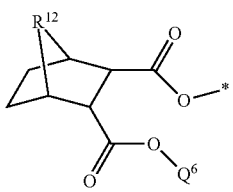

[Chemical Formula 8]

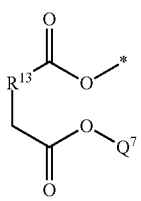

wherein, in Chemical Formulae 2 to 8, $R^7$ and $R^8$ are the same or different and are each independently hydrogen, substituted or unsubstituted C1 to C20 alkyl, an ester group, or an ether group, $R^9$, $R^{10}$, $R^{12}$ and $R^{13}$ are the same or different and are each independently substituted or unsubstituted C1 to C30 alkylenene, $R^{11}$ is —O—, —S—, —NR—, or substituted or unsubstituted C1 to C30 alkylene, wherein R is hydrogen, substituted or unsubstituted C1 to C20 alkyl, or substituted or unsubstituted C3 to C20 alkyl, and $Q^1$ to $Q^7$ are the same or different and are each independently hydrogen or a substituent represented by the following Chemical Formula 9,

[Chemical Formula 9]

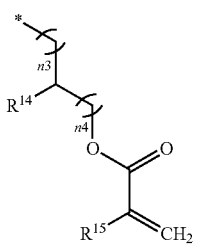

wherein, in Chemical Formula 9, $R^{14}$ is a hydroxy group, an amino group, or a thiol group, $R^{15}$ is hydrogen or substituted or unsubstituted C1 to C30 alkyl, and $n^3$ and $n^4$ are the same or different and are each independently integers ranging from 0 to 5.

2. The photosensitive resin composition for a color filter of claim 1, wherein the phenol-based resin comprises a compound represented by the following Chemical Formula 10:

[Chemical Formula 10]

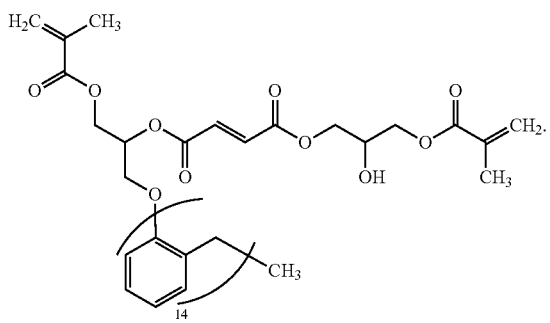

3. The photosensitive resin composition for a color filter of claim 1, wherein the phenol-based resin has an acid value of about 1 to about 150 mgKOH/g.

4. The photosensitive resin composition for a color filter of claim 1, wherein the phenol-based resin has a weight average molecular weight of about 500 to about 30,000 g/mol.

5. The photosensitive resin composition for a color filter of claim 1, wherein the binder resin further comprises an acrylic-based resin, a cardo-based resin, or a combination thereof.

6. The photosensitive resin composition for a color filter of claim 5, comprising the phenol-based resin in an amount of about 0.5 to about 20 wt % based on the total weight of the binder resin.

7. The photosensitive resin composition for a color filter of claim 1, wherein the photosensitive resin composition for a color filter comprises
about 1 to about 40 wt % of the binder resin (A);
about 1 to about 30 wt % of the photopolymerizable monomer (B);
about 0.1 to about 10 wt % of the photopolymerization initiator (C);
about 1 to about 40 wt % of the colorant (D); and
balance amount of the solvent (E).

8. The photosensitive resin composition for a color filter of claim 1, wherein the photosensitive resin composition further comprises malonic acid; 3-amino-1,2-propanediol; a silane-based coupling agent with a vinyl group or a (meth)acryloxy group; a leveling agent; a fluorine-based surfactant; a radical polymerization initiator, or a combination thereof.

9. A color filter manufactured using the photosensitive resin composition for a color filter according to claim 1.

* * * * *

UNITED STATES PATENT AND TRADEMARK OFFICE
CERTIFICATE OF CORRECTION

Page 1 of 1

PATENT NO. : 8,715,895 B2
APPLICATION NO. : 13/590471
DATED : May 6, 2014
INVENTOR(S) : Jung-Sik Choi et al.

It is certified that error appears in the above-identified patent and that said Letters Patent is hereby corrected as shown below:

In the Specification

Column 4, line 6 reads: "unsubstituted C3 to C20 ~~alkyl~~), or substituted or unsubsti-"
and should read: "unsubstituted C3 to C20 <u>allyl</u>), or substituted or unsubsti-"

Column 7, line 36 reads: "unsubstituted C3 to C20 ~~alkyl~~), or substituted or unsubsti-"
and should read: "unsubstituted C3 to C20 <u>allyl</u>), or substituted or unsubsti-"

In the Claims

Claim 1, Column 25, line 37 reads: "or unsubstituted C3 to C20 ~~alkyl~~, and"
and should read: "or unsubstituted C3 to C20 <u>allyl</u>, and"

Signed and Sealed this
Ninth Day of September, 2014

Michelle K. Lee
*Deputy Director of the United States Patent and Trademark Office*